United States Patent
Wang et al.

(10) Patent No.: US 9,949,367 B2
(45) Date of Patent: Apr. 17, 2018

(54) FLEXIBLE PRINTED CIRCUIT AND DETECTING DEVICE, DETECTING METHOD AND DISPLAY DEVICE THEREOF

(71) Applicants: BOE TECHNOLOGY GROUP CO., LTD., Beijing (CN); HEFEI BOE OPTOELECTRONICS TECHNOLOGY CO., LTD., Hefei, Anhui (CN)

(72) Inventors: Yimin Wang, Beijing (CN); Xingguang Jin, Beijing (CN); Lei Jin, Beijing (CN); Ping Chen, Beijing (CN); Pengjun Fang, Beijing (CN)

(73) Assignees: BOE TECHNOLOGY GROUP CO., LTD., Beijing (CN); HEFEI BOE OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 89 days.

(21) Appl. No.: 15/098,958

(22) Filed: Apr. 14, 2016

(65) Prior Publication Data
US 2016/0356840 A1 Dec. 8, 2016

(30) Foreign Application Priority Data
Jun. 2, 2015 (CN) .......................... 2015 1 0297637

(51) Int. Cl.
*G01R 31/28* (2006.01)
*G01R 31/304* (2006.01)
(Continued)

(52) U.S. Cl.
CPC ......... *H05K 1/0296* (2013.01); *H05K 1/0286* (2013.01); *H05K 1/118* (2013.01);
(Continued)

(58) Field of Classification Search
CPC .. G01R 31/043; G01R 31/2635; G01R 1/067; G01R 1/06; G01R 1/07328; G09G 3/006;
(Continued)

(56) References Cited

U.S. PATENT DOCUMENTS 6,045,396 A * 4/2000 Tighe ..................... H01R 12/62 439/493
6,230,397 B1 * 5/2001 Tighe ..................... H01R 12/62 228/56.3
(Continued)

FOREIGN PATENT DOCUMENTS

| CN | 202262059 U | | 5/2012 |
|---|---|---|---|
| CN | 102721848 A | * | 10/2012 |
| JP | 2005285887 A | | 10/2005 |

OTHER PUBLICATIONS

Chinese office action dated Nov. 16, 2017 for corresponding application 201610146271.7 with English translation attached.

*Primary Examiner* — Patrick Assouad
*Assistant Examiner* — Sean Curtis
(74) *Attorney, Agent, or Firm* — Nath, Goldberg & Meyer; Joshua B. Goldberg; Annie Kock

(57) ABSTRACT

Disclosed are a flexible printed circuit and a detecting device, a detecting method and a display device thereof. The flexible printed circuit comprises a body and an interface structure that is connected with the body, wherein the interface structure is provided with a plurality of mark lines dividing the interface structure into a plurality of interfaces with the same structure. When a front end interface of the flexible printed circuit of the disclosure is damaged, the front end interface can be removed along the mark line, and then an exposed rear end interface can be used successively, thus preventing a situation where the flexible printed circuit cannot be used because the only interface is damaged, thereby extending the life span of the flexible printed circuit, (Continued)

reducing productivity loss due to frequent replacements of the flexible printed circuit and reducing production cost.

8 Claims, 4 Drawing Sheets

(51) Int. Cl.
    *G01R 31/306*      (2006.01)
    *G01R 31/309*      (2006.01)
    *H05K 1/02*      (2006.01)
    *H05K 1/11*      (2006.01)

(52) U.S. Cl.
    CPC . *H05K 1/0268* (2013.01); *H05K 2201/09727* (2013.01); *H05K 2203/0228* (2013.01); *H05K 2203/162* (2013.01); *H05K 2203/175* (2013.01)

(58) Field of Classification Search
    CPC . G09G 3/3233; G09G 2330/12; H04N 9/3191
    USPC ......... 324/760.01–760.02, 763.01, 555–556, 324/770
    See application file for complete search history.

(56) References Cited

U.S. PATENT DOCUMENTS

| | | | | |
|---|---|---|---|---|
| 6,274,819 B1* | 8/2001 | Li | ................. | H05K 1/0293 174/254 |
| 8,804,348 B2* | 8/2014 | Tanaka | ................. | H05K 1/0281 174/254 |
| 8,929,085 B2* | 1/2015 | Franklin | ................. | G06F 1/1626 361/749 |
| 9,274,562 B2* | 3/2016 | Franklin | ................. | G06F 1/1626 |
| 9,356,087 B1* | 5/2016 | Lee | ................. | H01L 27/3276 |
| 9,377,635 B2* | 6/2016 | Kim | ................. | G02F 1/1309 |
| 9,480,155 B2* | 10/2016 | Posner | ................. | G06F 1/1616 |
| 9,594,402 B2* | 3/2017 | Hiroki | ................. | G06F 1/163 |
| 9,618,564 B2* | 4/2017 | Mayo | ................. | G01R 31/2818 |
| 9,710,033 B2* | 7/2017 | Yamazaki | ................. | G06F 1/1635 |
| 9,717,141 B1* | 7/2017 | Tegg | ................. | H05K 1/0268 |
| 9,746,879 B2* | 8/2017 | Clayton | ................. | G06F 1/16 |
| 2006/0192585 A1* | 8/2006 | Chen | ................. | G09G 3/006 324/760.01 |
| 2009/0283300 A1* | 11/2009 | Grunthaner | ................. | G06F 3/0416 174/254 |
| 2010/0305420 A1* | 12/2010 | Curry | ................. | G01N 27/3272 600/345 |
| 2012/0092837 A1* | 4/2012 | Tanaka | ................. | H05K 1/0281 361/749 |
| 2014/0187088 A1* | 7/2014 | Kim | ................. | G02F 1/1309 439/620.01 |
| 2015/0049275 A1* | 2/2015 | Posner | ................. | G02F 1/13306 349/42 |
| 2015/0212114 A1* | 7/2015 | Mayo | ................. | G01R 31/2818 324/750.26 |
| 2016/0014915 A1* | 1/2016 | Posner | ................. | G06F 1/1616 361/679.55 |
| 2016/0079670 A1* | 3/2016 | Vance | ................. | H01Q 1/243 343/788 |
| 2016/0172623 A1* | 6/2016 | Lee | ................. | H01L 51/5253 257/40 |
| 2016/0356840 A1* | 12/2016 | Wang | ................. | H05K 1/0296 |
| 2017/0164483 A1* | 6/2017 | Kouchi | ................. | H05K 1/189 |
| 2017/0237027 A1* | 8/2017 | Lee | ................. | H01L 51/0097 257/40 |

\* cited by examiner

FLEXIBLE PRINTED CIRCUIT AND DETECTING DEVICE, DETECTING METHOD AND DISPLAY DEVICE THEREOF

CROSS REFERENCES TO RELATED APPLICATIONS

This application claims the benefit of Chinese Patent Application No. 201510297637.6 filed on Jun. 2, 2015 in the Chinese Intellectual Property Office, the disclosure of which is hereby incorporated in its entirety by reference.

FIELD OF THE INVENTION

The disclosure relates to the field of display technology, and particularly relates to a flexible printed circuit and a detecting device, a detecting method and a display device thereof.

BACKGROUND OF THE INVENTION

During production of liquid crystal display panels, a Flexible Printed Circuit (FPC) is desired to transmit signals. FPC is a kind of printed circuit board with high reliability and flexibility. It is made of a base material of polyimide or polyester film, characterized in high wiring density, light weight and thin thickness, and used for signal transmission between a signal generating device and a liquid crystal display module. However, in the case of repeated insertion and extraction, an interface of the flexible printed circuit tends to be damaged due to limitations of the material and appearance of the flexible printed circuit, thereby greatly reducing life span of the flexible printed circuit, causing great waste of materials and thus increasing production cost.

SUMMARY OF THE INVENTION

An object of this disclosure is to provide a flexible printed circuit and a detecting device, a detecting method and a display device thereof that can solve the problem of interface of the flexible printed circuit being damaged in the prior art.

According to a first aspect of the disclosure, there is provided a flexible printed circuit, comprising:
a body; and
an interface structure being connected with the body,
wherein the interface structure is provided with a plurality of mark lines that divides the interface structure into a plurality of same interfaces.

According to a second aspect of the disclosure, there is provided the flexible printed circuit according to the first aspect,
wherein the interface comprises a plurality of first metal contact points provided on a first surface of the interface, and the body comprises a plurality of first metal lines, wherein corresponding first metal contact points of adjacent interfaces are connected to each other and a first metal contact point of an interface adjoining the body is connected with a corresponding first metal line.

According to a third aspect of the disclosure, there is provided the flexible printed circuit according to the first aspect,
wherein the interface comprises a second metal line provided on a surface of the interface and located at an edge of the interface away from the body.

According to a fourth aspect of the disclosure, there is provided the flexible printed circuit according to the second aspect,
wherein the interface further comprises a second metal line provided on a second surface of the interface opposite to the first surface and located at an edge of the interface away from the body.

According to a fifth aspect of the disclosure, there is provided a display device comprising the flexible printed circuit according to the first aspect.

According to a sixth aspect of the disclosure, there is provided a detecting device of a flexible printed circuit, comprising:
a detecting apparatus; and
a connecting apparatus being connected with the detecting apparatus,
wherein the flexible printed circuit is the flexible printed circuit according to the first aspect, comprising a front end interface that is the furthest interface from the body and having a second metal line, and the connecting apparatus is connected with the front end interface; and
the detecting apparatus is connected with both ends of the second metal line via the connecting apparatus to determine whether a circuit loop is formed.

According to a seventh aspect of the disclosure, there is provided the detecting device of the flexible printed circuit according to the sixth aspect,
wherein the connecting apparatus comprises a base and a cover plate that are oppositely disposed to form a socket, the socket has a connecting finger at the bottom thereof to be connected with the first metal contact point, and accommodates the front end interface to connect the connecting finger with a corresponding first metal contact point; and
both sides of a surface of the cover plate are respectively provided with a second metal contact point at edge positions, the second metal contact points being respectively connected with both ends of the second metal line of the front end interface, and the detecting apparatus being connected between the second metal contact points.

According to an eighth aspect of the disclosure, there is provided the detecting device of the flexible printed circuit according to the seventh aspect,
wherein the detecting apparatus comprises a power source and a light emitting diode.

According to a ninth aspect of the disclosure, there is provided the detecting device of the flexible printed circuit according to the seventh aspect,
wherein the detecting apparatus comprises a loop detecting unit.

According to a tenth aspect of the disclosure, there is provided the detecting device of the flexible printed circuit according to the ninth aspect,
wherein the loop detecting unit is a multimeter.

According to an eleventh aspect of the disclosure, there is provided a detecting method of a detecting device,
wherein the detecting method is used to detect the flexible printed circuit according the first aspect, the detecting device comprises a connecting apparatus and a detecting apparatus that are connected with each other, the flexible printed circuit comprises a front end interface that is the furthest interface from the body and has a second metal line, and the connecting apparatus is connected with the front end interface; and
the detecting method comprises:
determining whether a circuit loop is formed by connecting the detecting apparatus with both ends of the second metal line via the connecting apparatus.

According to a twelfth aspect of the disclosure, there is provided the detecting method of the detecting device according to the eleventh aspect, wherein the connecting apparatus comprises a base and a cover plate that are oppositely disposed to form a socket, the socket has a connecting finger at the bottom thereof to be connected with the first metal contact point, and accommodates the front end interface to connect the connecting finger with a corresponding first metal contact point; and both sides of a surface of the cover plate are respectively provided with a second metal contact point at edge positions, the second metal contact points being respectively connected with both ends of the second metal line of the front end interface, and the detecting apparatus being connected between the second metal contact points.

According to a thirteenth aspect of the disclosure, there is provided the detecting method of the detecting device according to the twelfth aspect, wherein the detecting apparatus comprises a power source and a light emitting diode; and the detecting apparatus is connected with both ends of the second metal line of the front end interface via the connecting apparatus to determine whether a circuit loop is formed, the steps of determining whether a circuit loop is formed comprising:

determining that a circuit loop is formed if the light emitting diode emits light; and determining that a circuit loop is not formed if the light emitting diode does not emits light.

According to a fourteenth aspect of the disclosure, there is provided the detecting method of the detecting device according to the twelfth aspect, wherein the detecting apparatus comprises a loop detecting unit, and the detecting apparatus is connected with both ends of the second metal line of the front end interface via the connecting apparatus to determine whether a circuit loop is formed, the steps of determining whether a circuit loop is formed comprising:

determining that a circuit loop is formed if a measured value of the loop detecting unit changes; and determining that a circuit loop is not formed if the measured value of the loop detecting unit does not change.

According to a fifteenth aspect of the disclosure, there is provided the detecting method of the detecting device according to the fourteenth aspect, wherein the loop detecting unit is a multimeter.

In the flexible printed circuits according to the first to fourth aspects and the display device according to the fifth aspect, when the front end interface of the flexible printed circuit of the disclosure is damaged, the front end interface can be removed along a mark line, and then an exposed rear end interface can be used successively, thus preventing a situation where the flexible printed circuit cannot be used because the only interface is damaged, thereby extending the life span of the flexible printed circuit, reducing productivity loss due to frequent replacements of the flexible printed circuit and reducing production cost.

In the detecting device of the flexible printed circuit according to the sixth aspect and the detecting method of the detecting device according to the eleventh aspect, repeated confirmation actions caused by poor contact between the flexible printed circuit and the connecting apparatus are avoided, thereby reducing work time, improving work efficiency and reducing productivity loss.

In the detecting device of the flexible printed circuit according to the seventh aspect and the detecting method of the detecting device according to the twelfth aspect, poor plug of the flexible printed circuit can be determined intuitively, thereby reducing misjudgment rate of the products and increasing yield thereof.

In the detecting device of the flexible printed circuit according to the eighth aspect and the detecting method of the detecting device according to the thirteenth aspect, a plug state of the flexible printed circuit can be automatically detected to determine whether there is a poor contact rapidly.

In the detecting device of the flexible printed circuit according to the ninth to tenth aspects and the detecting method of the detecting device according to the fourteenth to fifteenth aspects, whether the front end interface of the flexible printed circuit is damaged can be determined more precisely, thereby preventing misjudgment.

DETAILED DESCRIPTION OF THE EMBODIMENTS

In order that those skilled in the art can better understand the disclosure, exemplary embodiments of the flexible printed circuit and the detecting device, detecting method and display device thereof of the disclosure will be illustrated below in detail in conjunction with the accompany drawings.

Figure 1:
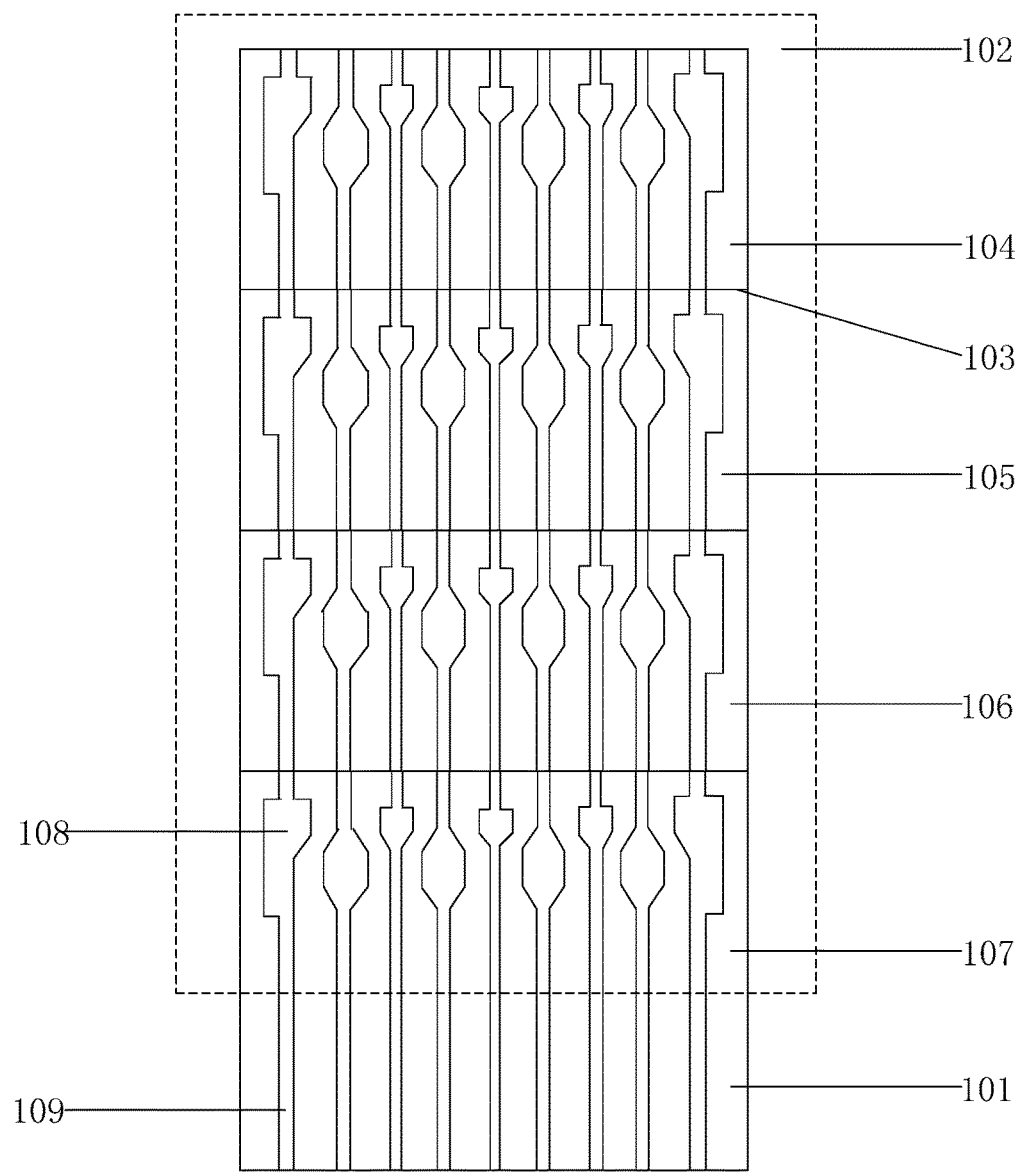
FIG. 1 is a structural schematic view showing a flexible printed circuit according to the exemplary embodiment of the disclosure.

According to one aspect of the disclosure, there is provided a flexible printed circuit. FIG. 1 is a structural schematic view showing a flexible printed circuit according to the exemplary embodiment of the disclosure. As shown in FIG. 1, the flexible printed circuit comprises a body 101 and an interface structure 102 that is connected with the body 101 and provided with a plurality of mark lines 103 dividing the interface structure 102 into a plurality of same interfaces. In the embodiment, the interface structure 102 has four interfaces which are named as a first interface 104, a second interface 105, a third interface 106 and a fourth interface 107 from front to back. In this case, the first interface 104 is a front end interface and the second interface 105 is a rear end interface. When the front end interface of the flexible printed circuit according to the embodiment is damaged, the front end interface may be removed along a mark line, and then an exposed rear end interface can be used successively. In this case, the second interface 105 is a front end interface and the third interface 106 is a rear end interface. Therefore, when the front end interface is damaged again, as discussed above, the front end interface may be removed along another mark line such that the exposed rear end interface can be used successively. Those skilled in the art shall understand that the number of interfaces included in the interface structure 102 may be less or more than four.

In the embodiment, the interface comprises a plurality of first metal contact points 108 disposed on a first surface (front face of the FPC) thereof, and the body 101 comprises a plurality of first metal lines 109 that are disposed corresponding to the first metal contact points 108 one by one. Referring to FIG. 1, the first metal contact points 108 at corresponding positions of the first interface 104 and the second interface 105 are connected to each other, the first metal contact points 108 at corresponding positions of the second interface 105 and the third interface 106 are connected to each other, the first metal contact points 108 at corresponding positions of the third interface 106 and the fourth interface 107 are connected to each other, and the first metal contact points 108 of the fourth interface 107 are connected to a corresponding first metal line 109.

Figure 2:
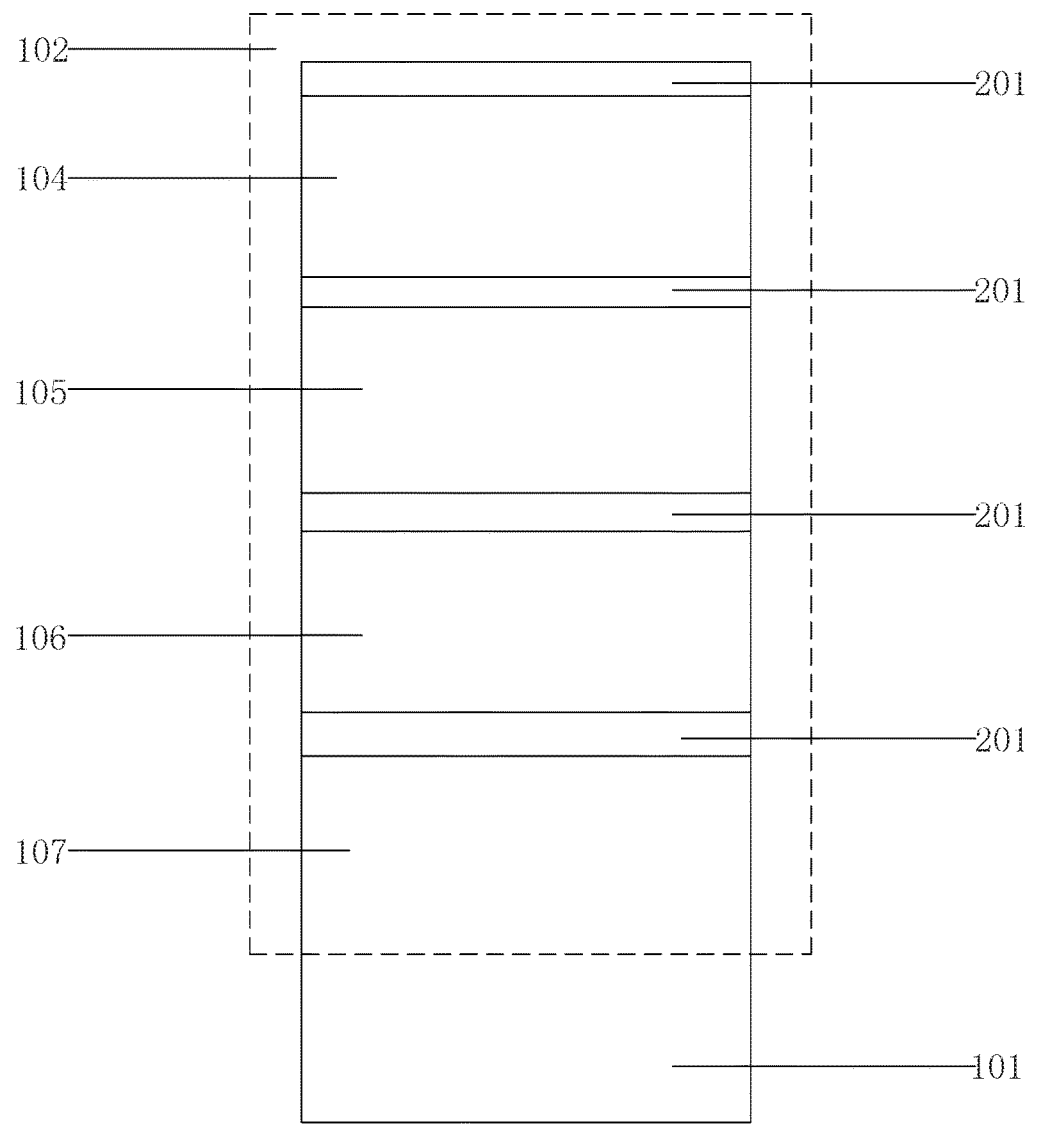
FIG. 2 is a schematic view showing a back face of the flexible printed circuit of FIG. 1.

FIG. 2 is a schematic view showing a back face of the flexible printed circuit of FIG. 1. As shown in FIG. 2, the interface further comprises a second metal line 201 provided on a second surface (back face of the FPC) thereof opposite to the first surface and located at an edge of the interface away from the body 101.

The flexible printed circuit of the embodiment comprises a body and an interface structure that is connected with the body and provided with a plurality of mark lines dividing the interface structure into a plurality of same interfaces. When a front end interface of the flexible printed circuit according to the embodiment is damaged, the front end interface can be removed along a mark line, and then an exposed rear end interface can be used successively, thus preventing a situation where the flexible printed circuit cannot be used because the only interface is damaged, thereby extending the life span of the flexible printed circuit, reducing productivity loss due to frequent replacements of the flexible printed circuit and reducing production cost.

According to another aspect of the disclosure, there is provided a display device comprising said flexible printed circuit. Details of the flexible printed circuit may refer to the above description and will not be repeated herein.

In the display device of the embodiment, the flexible printed circuit comprises a body and an interface structure that is connected with the body and provided with a plurality of mark lines dividing the interface structure into a plurality of same interfaces. When a front end interface of the flexible printed circuit according to the embodiment is damaged, the front end interface can be removed along a mark line, and then an exposed rear end interface can be used successively, thus preventing a situation where the flexible printed circuit cannot be used because the only interface is damaged, thereby extending the life span of the flexible printed circuit, reducing productivity loss due to frequent replacements of the flexible printed circuit and reducing production cost.

Figure 3:
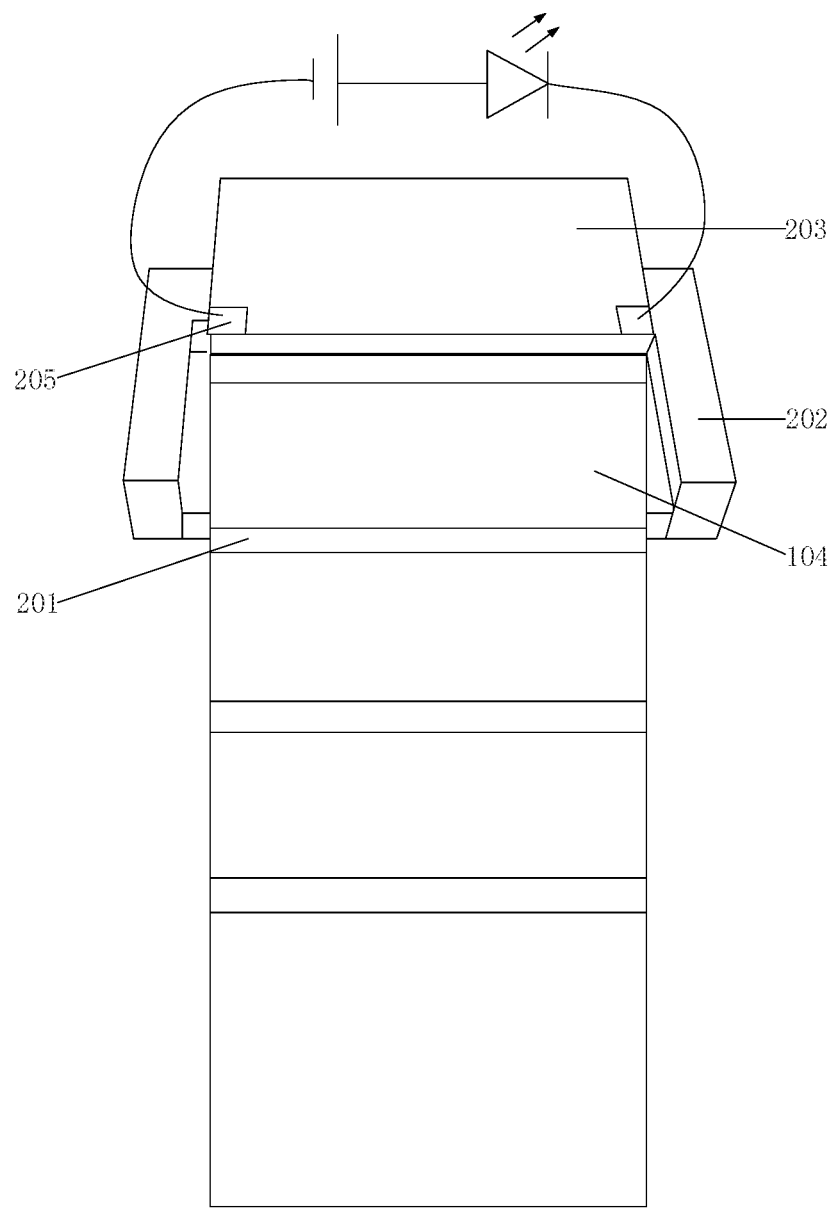
FIG. 3 is a structural schematic view showing a detecting device according to the exemplary embodiment of the disclosure.

According to yet another aspect of the disclosure, there is provided a detecting device of a flexible printed circuit. FIG. 3 is a structural schematic view showing a detecting device according to the exemplary embodiment of the disclosure. As shown in FIG. 3, the detecting device for detecting said flexible printed circuit comprises a connecting apparatus and a detecting apparatus that are connected with each other. The connecting apparatus is connected with a front end interface of the flexible printed circuit that is the furthest interface from the body. The detecting apparatus is connected with both ends of the second metal line of the front end interface via the connecting apparatus to determine whether a circuit loop is formed, thereby realizing detection for damage or poor plug of the front end interface of the flexible printed circuit. The detecting device according to the embodiment may avoid repeated confirmation actions caused by poor contact between the flexible printed circuit and the connecting apparatus, thereby reducing work time, improving work efficiency and reducing productivity loss.

Figure 4:
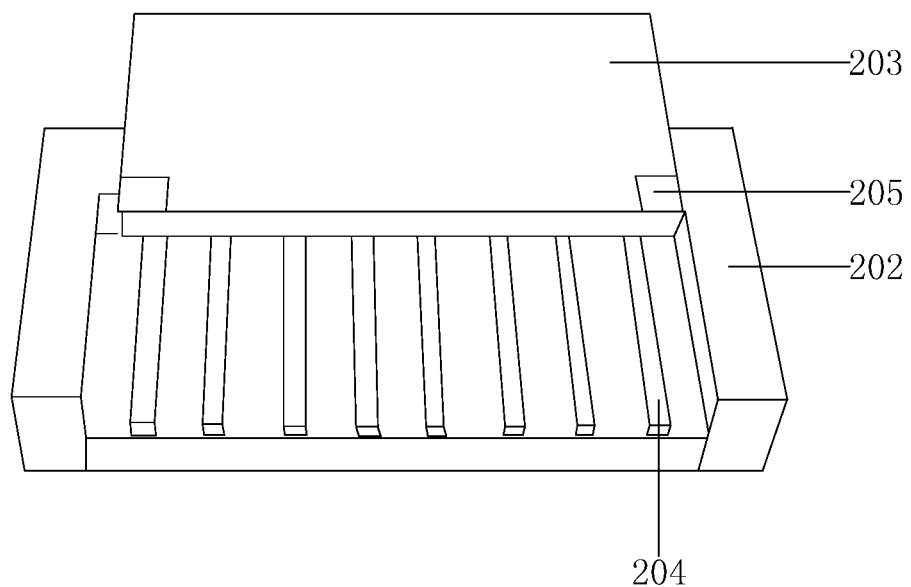
FIG. 4 is a structural schematic view showing the connecting apparatus of FIG. 3.

FIG. 4 is a structural schematic view showing the connecting apparatus of F Referring to FIGS. 1-4, the connecting apparatus comprises a base 202 and a cover plate 203 that are oppositely disposed to form a socket, the socket has a connecting finger 204 at the bottom thereof to be connected with the first metal contact point 108, and accommodates the front end interface to connect the connecting finger 204 with a corresponding first metal contact point 108. Both sides of a surface of the cover plate 203 are respectively provided with a second metal contact point 205 at edge positions, the second metal contact points 205 are respectively connected with both ends of the second metal line 201 of the front end interface. The detecting apparatus is connected between the second metal contact points. Specifically, two ends of the detecting apparatus are respectively connected with two second metal contact points 205. Then, the detecting apparatus is connected to both ends of the second metal line 201 via two second metal contact points 205. With slight edge chipping of the front end interface of the flexible printed circuit, whether the front end interface can be used normally may be determined by detecting whether two ends of the second metal line 201 form a closed circuit, thereby poor plug of the flexible printed circuit can be determined intuitively, misjudgment of products is reduced and yield is improved.

Referring to FIG. 3, the detecting apparatus comprises a power source and a light emitting diode that are connected to each other, the power source is connected with a second metal contact point and the light emitting diode is connected with another second metal contact point. In the above circuit, it indicates that a circuit loop is formed if the light emitting diode emits light, then it can be determined that the front end interface of the flexible printed circuit is in a good contact. It indicates that the circuit loop is not formed if the light emitting diode does not emit light, then it can be determined that the front end interface of the flexible printed circuit is in a situation of edge chipping or poor plug, thus an automatic detection may be conducted to detect the plugging state of the flexible printed circuit to enable a rapid judgment on whether there is a poor contact.

Alternatively, the detecting apparatus comprises a loop detecting unit, two ends of which are respectively connected with two second metal contact points. When it cannot determine whether a slight chipping of the front end interface of the flexible printed circuit causes abnormal lighting by using the light emitting diode, the loop detecting unit may be used to detect the flexible printed circuit to make a better judgment on whether the front end interface of the flexible printed circuit is damaged, thereby avoiding misjudgment.

Alternatively, the loop detecting unit is a multimeter.

In the detecting device of the embodiment, the flexible printed circuit comprises a body and an interface structure that is connected with the body and provided with a plurality of mark lines dividing the interface structure into a plurality of same interfaces. When a front end interface of the flexible printed circuit according to the embodiment is damaged, the front end interface can be removed along a mark line, and then an exposed rear end interface can be used successively, thus preventing a situation where the flexible printed circuit cannot be used because the only interface is damaged, thereby extending the life span of the flexible printed circuit, reducing productivity loss due to frequent replacements of the flexible printed circuit and reducing production cost.

According to yet another aspect of the disclosure, there is provided a detecting method of a detecting device used for detecting said flexible printed circuit. The detecting device comprises a connecting apparatus and a detecting apparatus that are connected with each other. The connecting apparatus is connected with a front end interface of the flexible printed circuit that is the furthest interface from the body.

The detecting method comprises:

determining whether a circuit loop is formed by connecting the detecting apparatus with both ends of the second metal line of the front end interface via the connecting apparatus.

Referring to FIGS. 1-4, the connecting apparatus comprises a base 202 and a cover plate 203 that are oppositely disposed to form a socket, the socket has a connecting finger 204 at the bottom thereof to be connected with the first metal contact point 108, and accommodates the front end interface to connect the connecting finger 204 with a corresponding first metal contact point 108. Both sides of a surface of the cover plate 203 are respectively provided with a second metal contact point 205 at edge positions, the second metal contact points 205 are respectively connected with both ends of the second metal line 201 of the front end interface, and two ends of the detecting apparatus are connected with two of the second metal contact points 205 respectively. In this case, the detecting apparatus is connected to both ends of the second metal line 201 via two second metal contact points 205. With slight edge chipping of the front end interface of the flexible printed circuit, whether the front end interface can be used normally may be determined by detecting whether two ends of the second metal line 201 form a closed circuit, thereby poor plug of the flexible printed circuit can be determined intuitively, misjudgment of products is reduced and yield is improved.

Referring to FIG. 3, the detecting apparatus comprises a power source and a light emitting diode that are connected to each other, the power source is connected with a second metal contact point and the light emitting diode is connected with another second metal contact point. In the above circuit, it indicates that a circuit loop is formed if the light emitting diode emits light, thereby confirming that the front end interface of the flexible printed circuit is in good contact. It indicates that the circuit loop is not formed if the light emitting diode does not emit light, then it can be determined that the front end interface of the flexible printed circuit is in a situation of edge chipping or poor plug, thus an automatic detection may be conducted to detect the plugging state of the flexible printed circuit to enable a rapid judgment on whether there is a poor contact.

Alternatively, the detecting apparatus comprises a loop detecting unit, two ends of which are respectively connected with two second metal contact points. Specifically, it indicates that a circuit loop is formed if a measured value of the loop detecting unit changes, then it can be determined that the front end interface of the flexible printed circuit is in a good contact. It indicates that a circuit loop is not formed if the measured value of the loop detecting unit does not change, then it can be determined that the front end interface of the flexible printed circuit is in a situation of edge chipping or poor plug. When it cannot determine whether a slight chipping of the front end interface of the flexible printed circuit causes abnormal lighting by using the light emitting diode, a loop detecting unit may be used to detect the flexible printed circuit to make a better judgment on whether the front end interface of the flexible printed circuit is damaged, thereby avoiding misjudgment.

Alternatively, the loop detecting unit is a multimeter.

In the detecting method of the embodiment, the flexible printed circuit comprises a body and an interface structure that is connected with the body and provided with a plurality of mark lines dividing the interface structure into a plurality of same interfaces. When a front end interface of the flexible printed circuit according to the embodiment is damaged, the front end interface can be removed along a mark line, and then an exposed rear end interface can be used successively, thus preventing a situation where the flexible printed circuit cannot be used because the only interface is damaged, thereby extending the life span of the flexible printed circuit, reducing productivity loss due to frequent replacements of the flexible printed circuit and reducing production cost.

It should be understood that the above embodiments are merely exemplary embodiments for the purpose of illustrating the principle of the disclosure, and the disclosure is not limited thereto. Various modifications and improvements can be made by a person having ordinary skill in the art without departing from the spirit and essence of the disclosure. Accordingly, all of the modifications and improvements also fall into the protection scope of the disclosure.

The invention claimed is:

1. A detecting device of a flexible printed circuit comprising:
   a detecting apparatus; and
   a connecting apparatus being connected with the detecting apparatus,
   wherein the flexible printed circuit comprises a body and an interface structure being connected with the body, the interface structure is provided with a plurality of mark lines that divide the interface structure into a plurality of same interfaces, the flexible printed circuit further comprises a front end interface that is the furthest interface from the body and having a second metal line, and the connecting apparatus is connected with the front end interface;
   wherein the detecting apparatus is connected with both ends of the second metal line via the connecting apparatus to determine whether a circuit loop is formed;
   wherein the connecting apparatus comprises a base and a cover plate that are oppositely disposed to form a socket, the socket has a connecting finger at a bottom thereof to be connected with a first metal contact point, and accommodates the front end interface to connect the connecting finger with the corresponding first metal contact point; and
   wherein both sides of a surface of the cover plate are respectively provided with a second metal contact point at edge positions, the second metal contact points being respectively connected with both ends of the second metal line of the front end interface, and the detecting apparatus being connected between the second metal contact points.

2. The detecting device of the flexible printed circuit according to claim 1,
   wherein the detecting apparatus comprises a power source and a light emitting diode.

3. The detecting device of the flexible printed circuit according to claim 1,
   wherein the detecting apparatus comprises a loop detecting unit.

4. The detecting device of the flexible printed circuit according to claim 3,
   wherein the loop detecting unit is a multimeter.

5. A detecting method of a detecting device,
   wherein the detecting method is used to detect a flexible printed circuit comprising a body and an interface structure being connected with the body, the interface structure is provided with a plurality of mark lines that divide the interface structure into a plurality of same interfaces, the detecting device comprises a connecting apparatus and a detecting apparatus that are connected with each other, the flexible printed circuit comprises a front end interface that is the furthest interface from the body and has a second metal line, and the connecting apparatus is connected with the front end interface; and the detecting method comprises:

determining whether a circuit loop is formed by connecting the detecting apparatus with both ends of the second metal line via the connecting apparatus;

wherein the connecting apparatus comprises a base and a cover plate that are oppositely disposed to form a socket, the socket has a connecting finger at a bottom thereof to be connected with a first metal contact point, and accommodates the front end interface to connect the connecting finger with the corresponding first metal contact point; and wherein both sides of a surface of the cover plate are respectively provided with a second metal contact point at edge positions, the second metal contact points being respectively connected with both ends of the second metal line of the front end interface, and the detecting apparatus being connected between the second metal contact points.

6. The detecting method of the detecting device according to claim 5, wherein the detecting apparatus comprises a power source and a light emitting diode; and the detecting apparatus is connected with both ends of the second metal line of the front end interface via the connecting apparatus to determine whether a circuit loop is formed, the steps of determining whether a circuit loop is formed comprising:

determining that a circuit loop is formed if the light emitting diode emits light; and determining that a circuit loop is not formed if the light emitting diode does not emits light.

7. The detecting method of the detecting device according to claim 5, wherein the detecting apparatus comprises a loop detecting unit, and the detecting apparatus is connected with both ends of the second metal line of the front end interface via the connecting apparatus to determine whether a circuit loop is formed, the steps of determining whether a circuit loop is formed comprising:

determining that a circuit loop is formed if a measured value of the loop detecting unit changes; and determining that a circuit loop is not formed if the measured value of the loop detecting unit does not change.

8. The detecting method of the detecting device according to claim 7, wherein the loop detecting unit is a multimeter.

* * * * *